United States Patent [19]
Ramer et al.

[11] Patent Number: 5,966,318
[45] Date of Patent: Oct. 12, 1999

[54] NONDESTRUCTIVE READOUT MEMORY UTILIZING FERROELECTRIC CAPACITORS ISOLATED FROM BITLINES BY BUFFER AMPLIFIERS

[75] Inventors: O. Glenn Ramer, Los Angeles; John J. Drab, Santa Barbara, both of Calif.; Larry D. McMillan; Carlos A. Paz de Araujo, both of Colorado Springs, Colo.

[73] Assignee: Raytheon Company, Lexington, Mass.

[21] Appl. No.: 08/768,256

[22] Filed: Dec. 17, 1996

[51] Int. Cl.[6] ................................................. G11C 11/22
[52] U.S. Cl. .............................................. 365/145; 365/149
[58] Field of Search ................................. 365/145, 149; 257/295

[56] References Cited

U.S. PATENT DOCUMENTS 5,262,983  11/1993  Brennan .................................. 365/145
5,297,077  3/1994  Imai ........................................ 365/145
5,303,182  4/1994  Nakao ..................................... 365/145
5,559,733  9/1996  McMillan ............................... 365/145

*Primary Examiner*—A. Zarabian
*Attorney, Agent, or Firm*—William C. Schubert; Glenn H. Lenzen, Jr.

[57] ABSTRACT

A memory includes a bitline data signal input (24), at least one memory unit (20), a writing circuit (128) which writes a polarization state into each memory unit (20) responsive to the bitline data signal input, and a sensing circuit (130) that senses a polarization state of each memory unit (20). Each memory unit (20) includes a ferroelectric capacitor (22) and a buffer amplifier (26) in electrical series relationship with the ferroelectric capacitor (22) and the bitline data signal input (24). The buffer amplifier (26) capacitively isolates the ferroelectric capacitor (22) from the bitline data signal input (24) so that the ferroelectric capacitor (22) may be made smaller in size than would otherwise be the case.

13 Claims, 7 Drawing Sheets

NONDESTRUCTIVE READOUT MEMORY UTILIZING FERROELECTRIC CAPACITORS ISOLATED FROM BITLINES BY BUFFER AMPLIFIERS

This invention was made with Government support under Contract No. N00030-93-C-0002 awarded by the Department of the Navy. The Government has certain rights in this invention.

BACKGROUND OF THE INVENTION

This invention relates to a random access memory which utilizes a ferroelectric capacitor as its basic storage unit, and, more particularly, to such a memory wherein the ferroelectric capacitor is isolated from the data bitline capacitances by a buffer amplifier.

Many military and some civilian systems require data storage capability in a random access memory that is non-volatile and resistant to data loss due to disruptive events. A nonvolatile memory retains the stored data even when power is lost or turned off. Such nonvolatile memories are often based upon physical changes that occur in a memory element when data is stored, which physical changes are not reversed or randomized upon the loss of power.

Ferroelectric materials have been successfully developed for use in nonvolatile memories. A ferroelectric material is one whose physical state changes upon the application of an electrical field, in a manner analogous with the change undergone by ferromagnetic materials to which a magnetic field is applied. The ferroelectric material has the advantages that its physical state can be controlled by the application of a voltage rather than a magnetic field or current, a measurable physical state is retained after a power loss, and memory elements can be constructed by microelectronics fabrication techniques.

To utilize this capability, the ferroelectric material is typically made the dielectric of a capacitor, so that the physical state of the ferroelectric material may be either changed or sensed by applying a voltage to the plates of the ferroelectric capacitor. Electronic circuitry is provided to write data into the ferroelectric capacitor by altering its physical state using an applied voltage and to read the stored data by sensing the physical state of the ferroelectric capacitor.

There are two classes of read circuitry used in ferroelectric memories. In a destructive readout (DRO), the physical state of the capacitor is erased and the stored data must be rewritten as part of each memory cycle. Accordingly, there is a short but finite time period during each read cycle where the data is stored only in the electronics of the device. In the other type of readout, nondestructive readout (NDRO), the stored data is not erased during reading. There are two types of NDRO ferroelectric memories. In the first type of NDRO ferroelectric memory, the memory will recover without loss of data from several, typically 2–20, power failures during reading without restoring. In the second type of NDRO ferroelectric memory, the number of reads without the requirement of restoring is very large or infinite, so that a restore during each read is not required.

Although existing nondestructive readout ferroelectric memories are fully operable, their size is large in comparison with that of conventional destructive readout, non-volatile random access memory devices. The number of memory units that may be packaged within a preselected size is therefore relatively small, limiting the total storage capacity of the memory. The large size does not pose a serious limitation for some applications where only a limited amount of information must be stored in a nonvolatile manner. The large size does limit the use of the ferroelectric memory in other applications.

There is a need for a nondestructive readout ferroelectric memory wherein the size of each memory unit is reduced, so that the total memory storage capacity may be increased. The present invention fulfills this need, and further provides related advantages.

SUMMARY OF THE INVENTION

The present invention provides a ferroelectric-based, non-destructive readout (NDRO) memory having a reduced size as compared with existing NDRO ferroelectric memories. The reduced size permits increased numbers of memory units within any preselected available physical size. The reduced capacitance associated with the reduced size also allows increased operating speed of the memory.

In accordance with the invention, a memory comprises a bitline data signal input, and at least two memory units. Each memory unit has a data state and comprises a ferroelectric capacitor in a given polarization state, and a buffer amplifier in electrical series relationship with the ferroelectric capacitor and the bitline data signal input. The memory further includes means for writing a data state into each memory unit responsive to the bitline data signal input, and means for sensing the data state of each memory unit (i.e., the change of the polarization state of the ferroelectric capacitor).

The present inventors have recognized that the size limitation on existing NDRO ferroelectric memories does not reside in the number of circuit elements in each memory unit, the arranging of the circuit elements, the manufacturing process, or a comparable reason. Instead, the size limitation is based upon the capacitive relationships required between the ferroelectric capacitor and the associated circuitry. The bitline that provides the data signal to the memory has a substantial amount of distributed capacitance. The required physical area of the ferroelectric capacitor is proportional to the capacitance of the bitline. With the existing physical arrangements of bitline and ferroelectric capacitor wherein the capacitance of the bitline is about 0.65 pf (picofarads), the size of each ferroelectric capacitor, and thence the size of each memory unit, must be at least about 200 square micrometers.

In the present approach, the buffer amplifier, preferably a MOSFET (metal-oxide-semiconductor field effect transistor) is placed between the ferroelectric capacitor and the bitline. The equivalent capacitance experienced by the ferroelectric capacitor is therefore the input capacitance of the buffer amplifier, which is typically about 0.5 ff (femtofarads). The physical size of the ferroelectric capacitor is proportional to the ratio of the capacitance of the buffer to the capacitance of the bitline. Accordingly, the size of the ferroelectric capacitor may be reduced substantially, and typically to an area of about 2 square micrometers, a factor of 100 reduction as compared with the conventional ferroelectric memory unit capacitor.

The present approach does add physical components to each memory unit, specifically a buffer amplifier and a bypass around the buffer amplifier. However, because the memory is preferably fabricated by microelectronic techniques wherein these added components may be made quite small, the net size of the memory unit is greatly reduced.

Other features and advantages of the present invention will be apparent from the following more detailed description of the preferred embodiment, taken in conjunction with

DETAILED DESCRIPTION OF THE INVENTION

Figure 1:
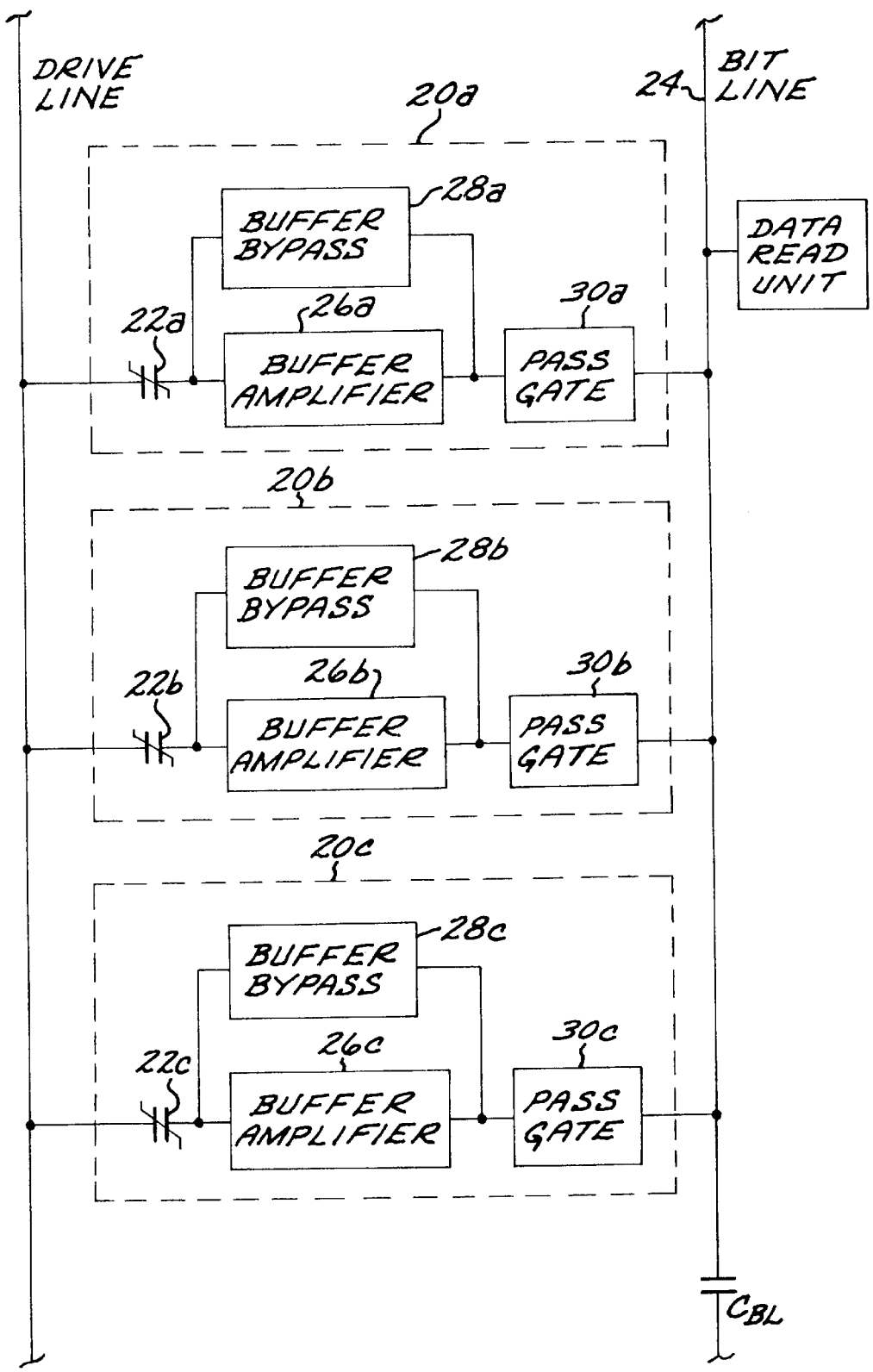
FIG. 1 is an electrical schematic drawing of a basic ferroelectric memory.

FIG. 1 illustrates a basic configuration for the approach of the invention. In a memory unit 20, one pole of a ferroelectric capacitor 22 is electrically connected to a drive line, and the other pole is connected to a bitline 24 upon which data is provided from an external source (not shown) for writing into the ferroelectric capacitor 22. In a typical memory, there is a plurality of memory units 20, with three such memory units 20a, 20b, and 20c illustrated in FIG. 1, and the bitline 24 is common to all of the memory units. Its distributed capacitance, schematically represented by a capacitance $C_{BL}$, is quite high and typically on the order of 1–10 pf. (The wide range in the value of the distributed capacitance is due to the many substrate technologies in use and the physical length of the bit line.)

According to the approach of the invention, in each of the memory units 20 a buffer amplifier 26 is in electrical series relation between the ferroelectric capacitor 22 and the bitline 24. The buffer amplifier 26 is preferably a MOSFET (metal-oxide-semiconductor field effect transistor). A bypass circuit 28 allows the buffer amplifier 26 to be controllably bypassed when data is to be written to the ferroelectric material of the ferroelectric capacitor 22. The memory address provided as input to the memory closes (shorts or physically connects) a passgate 30 to select the memory unit to which data is to be written or from which data is to be read.

The physical area of the ferroelectric capacitor 22 in the NDRO ferroelectric memory is proportional to the capacitance experienced by the pole which, but for the presence of the buffer amplifier 26, is connected to the bitline 24, because the signal detected by the sense circuitry is proportional to the area of the ferroelectric capacitor and inversely proportional to the sum of the ferroelectric capacitance and capacitance to ground at that pole. The effect of the presence of the buffer amplifier is to reduce the pole capacitance to the input capacitance of the buffer amplifier, $C_{BA}$. In order to maintain the same signal to the sense amplifier (assuming a gain of unity for the buffer), the physical size of the capacitor is reduced proportional to the ratio $C_{BA}/C_{BL}$. In a typical case, this ratio is about 100, so that the physical area of the ferroelectric capacitor 22 may be reduced from about 200 square micrometers to about 2 square micrometers. Stated alternatively, about 100 times the memory may be placed into an available space using the present approach as compared with an approach wherein no buffer amplifier is provided.

The approach of FIG. 1 is broadly applicable to any nondestructive readout memory utilizing a basic ferroelectric capacitor data storage unit. The approach of the invention is preferably utilized with a ferroelectric interruptible read memory of the type described in U.S. Pat. No. 5,487,030, whose disclosure is incorporated by reference, or with a nondestructive read ferroelectric memory of the type disclosed is copending application Ser. No. 08/296,835, whose disclosure is incorporated by reference. The approach of the invention is not limited to these two preferred embodiments, but is more generally applicable.

Figure 2:
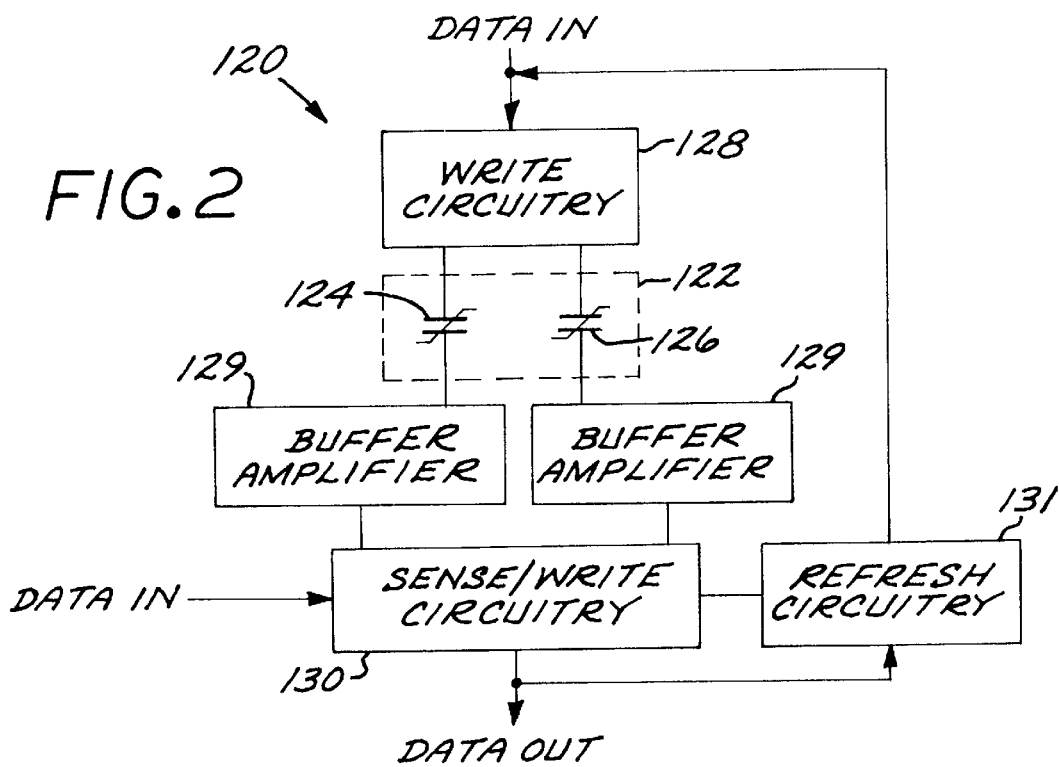
FIG. 2 is a schematic diagram of a ferroelectric interruptible read memory unit according to the present invention.

FIG. 2 depicts in schematic form a ferroelectric interruptible read memory unit 120 according to the present invention, for storing a single bit of information. A memory cell 122 includes a first ferroelectric capacitor 124 and a second ferroelectric capacitor 126. The ferroelectric capacitors 124 and 126 are electrically connected in parallel to a write circuit 128 and to a sense circuit 130. The ferroelectric capacitors are capacitively isolated from portions of the write circuit 128 by a buffer amplifier 129. The use of ferroelectric capacitors as the basic memory storage element renders the memory unit nonvolatile. The writing of data to memory produces a physical domain polarization within the ferroelectric capacitors. This polarization is not destroyed when the writing voltage is removed.

Figure 3:
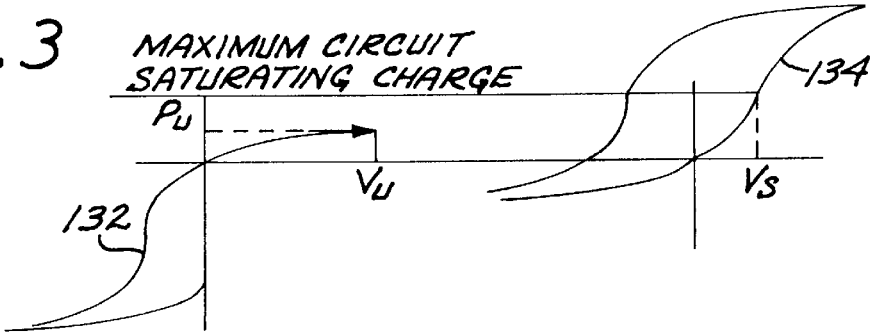
FIG. 3 is a schematic diagram of the two polarization-voltage curves for the ferroelectric capacitors of FIG. 2 in relation to each other, during nondestructive readout.

The principle underlying the ferroelectric interruptible read memory (FIRM) is illustrated in FIG. 3. The two ferroelectric capacitors 124 and 126 of the memory cell are represented by their respective polarization-voltage curves 132 and 134. In the operation of the memory unit 120, a single bit of information is stored in the memory cell 122 by the write circuitry 128. Based upon a selected data bit value (i.e., "1" or "0"), the write circuitry 128 applies voltages such that the ferroelectric capacitors 124 and 126 are placed into opposite, fully saturated polarization states. These states are retained after the applied writing voltage is removed.

When the information stored in the memory cell 122 is to be sensed (read), a sensing voltage is applied to switch a portion of the polarization of one of the ferroelectric capacitors toward the opposite state. In FIG. 3, the hysteresis curve on the left illustrates the polarization-applied field region for the ferroelectric capacitor in the minimum capacitance state, where the voltage across the ferroelectric capacitor reaches a maximum. It is emphasized that, by design, only a partial switching of the polarization state of one of the ferroelectric capacitors is accomplished during the sensing. In the preferred approach, the sensing voltage is selected in relation to the ferroelectric capacitances and other circuit parameters to achieve only the partial switching, not a complete switching, of the polarization state of the oppositely polarized ferroelectric capacitor. This partially switched state is stable in the sense that the physical polarization state of the ferroelectric capacitors is retained even after sensing is complete. Thus, the stored data is preserved within the memory unit and can be read out again without any further actions by way of refreshing the data state. Thus, this approach is termed Ferroelectric Interruptible Read Memory, NonDestructive ReadOut, or FIRM NDRO.

Figure 4:
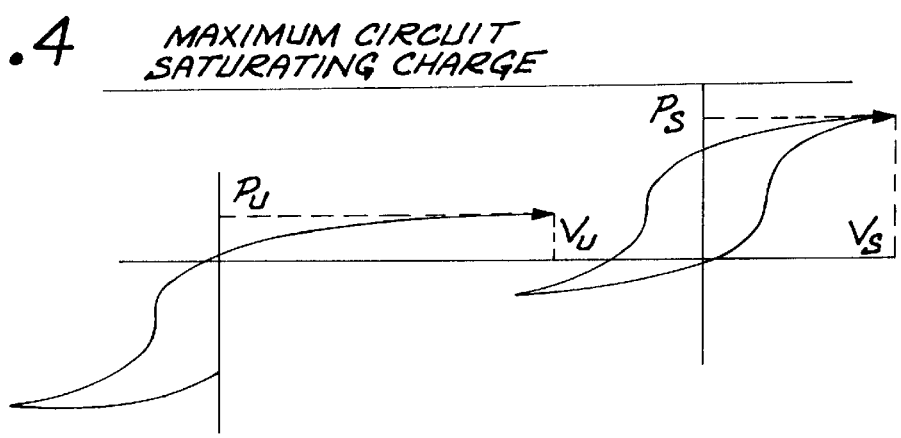
FIG. 4 is a schematic diagram of the two polarization-voltage curves for the ferroelectric capacitors of FIG. 2 in relation to each other, during destructive readout.

FIG. 4 depicts the polarization curves comparable to those of FIG. 3, but for a different readout approach that is not within the scope of the invention, and is distinct from the present approach. This readout approach, termed Destructive ReadOut or DRO, utilizes a complete switching of the polarization state of the oppositely polarized ferroelectric capacitor during sensing. The result of readout is that both ferroelectric capacitors are fully polarized in the same direction. The stored data is not stable in the same sense as for FIRM NDRO, because the stored data is not physically embodied in the state of the ferroelectric capacitors immediately upon readout.

For both FIRM NDRO and DRO, the conventional practice is to refresh the state of the memory cell after readout by the sense circuitry 130 is complete. That is, the sensed data is effectively communicated to the write circuitry 128 and rewritten back into the memory cell 122 for later recall, a process termed a "refresh", see the schematic refresh circuitry 131 of FIG. 2. In most instances, both FIRM NDRO and DRO would therefore give satisfactory results.

However, if an electrically disruptive, transient event occurs before the refresh is complete, the data stored in the DRO system is lost. Because the refreshing is not completed and the original data was obliterated during the sensing process in DRO, there is no way of reconstructing that data unless some other memory scheme is utilized. By contrast, in FIRM NDRO the physical state of the ferroelectric capacitors preserves the data during readout because the polarization state is only partly changed. Even if the refresh is not completed, the data is available for sensing in the next readout.

As shown in FIG. 3, the partial switching of the polarization state is accomplished by placing two constraints on the circuit design. First, the voltage across the ferroelectric capacitor when in the nonswitching or minimum capacitance state is just sufficient to saturate the polarization of the capacitor. Second, the circuitry design limits the amount of polarization that can be switched from the ferroelectric capacitor for any given application of the read voltage. This limit must be less than the available polarization. The minimum number of reads that can be interrupted without a refresh is the available maximum polarization divided by this limited switchable polarization. With consecutive interrupted readouts (i.e., readouts where no refresh occurs), the voltage across the switching ferroelectric capacitor increases until, at some point, the switching ferroelectric capacitor becomes a nonswitching ferroelectric capacitor and the stored data can no longer be successfully read.

Since some polarization reversal and charge transfer is required according to this approach., there is a practical limit to the number of readouts using the FIRM NDRO approach, without any refreshing. The limit arises due to the sensitivity of the sensing circuitry in detecting the differential polarization. The inventors have constructed prototypes of the present FIRM NDRO memory invention having the capability of 10–12 readouts without refresh. Studies have shown that, for most applications, such a capability gives highly satisfactory protection against data loss due to disruptions after sensing but before refreshing.

Figure 5:
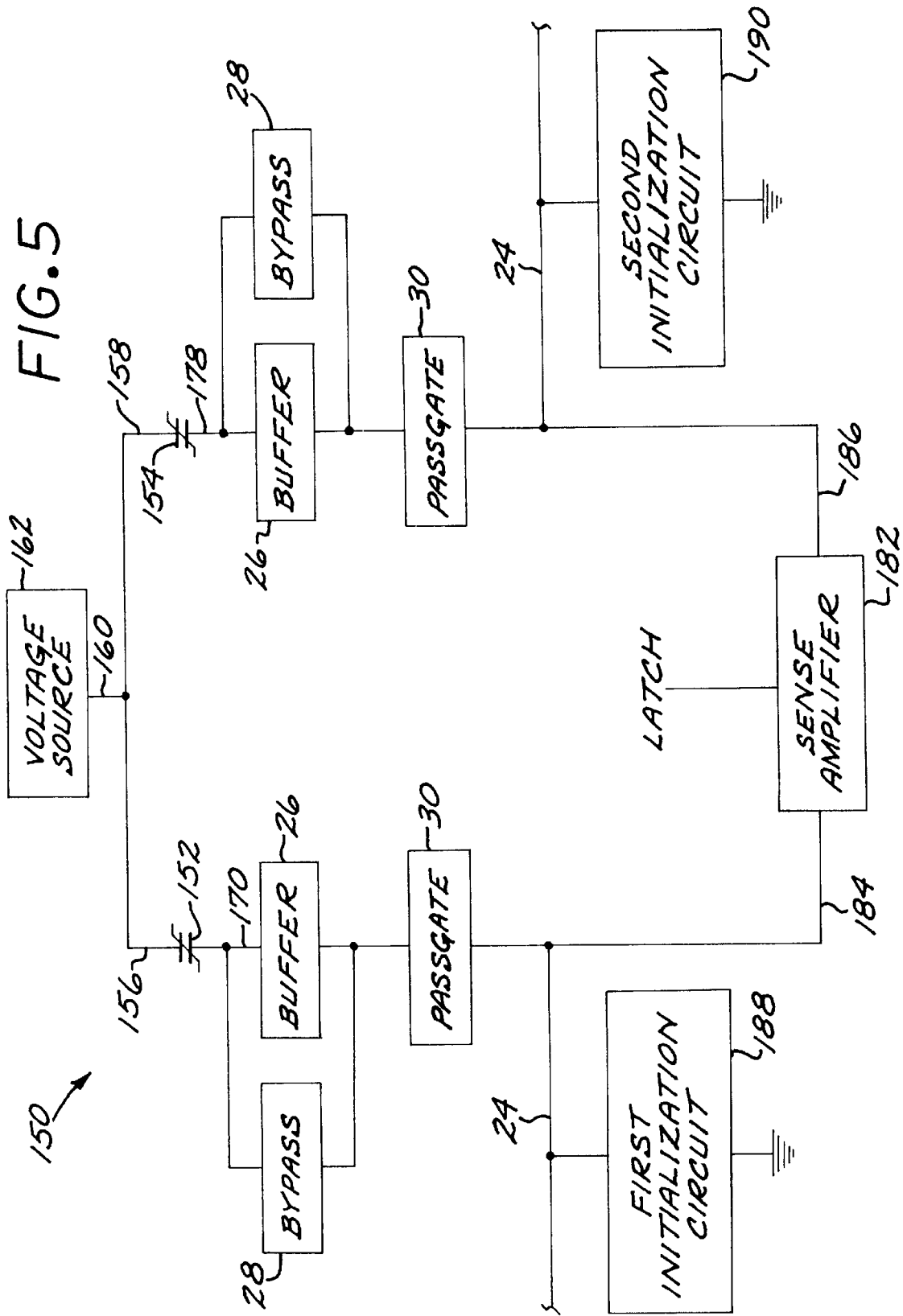
FIG. 5 is a circuit diagram of a first type of a ferroelectric interruptible read memory element utilizing the approach of the invention.

FIG. 5 illustrates; a preferred circuit for implementing the FIRM NDRO memory unit, with the preferred buffer amplifier, in a form compatible with the fabrication of large memory arrays by microelectronics fabrication technology, although other circuits will, of course, be possible. A memory unit 150 includes a first ferroelectric capacitor 152 and a second ferroelectric capacitor 154. Preferably, the two ferroelectric capacitors are as nearly identical as possible, but differences in properties do not render the memory cell inoperable. The respective inputs 156 and 158 of the ferroelectric capacitors 152 and 154 are connected to a common drive line 160, which in turn communicates with a voltage source 162 of a time-dependent voltage.

The respective outputs of the ferroelectric capacitors 152 and 154 are each connected to a buffer amplifier 26, which in turn is connected to a passgate 30. The bypass circuit 28 provides a controllable bypass around the buffer amplifier.

A latching sense amplifier 182 has a first input 184 in communication with the output of the first ferroelectric capacitor buffer amplifier 26 and a second input 186 in communication with the output of the second ferroelectric capacitor buffer amplifier 26 through its passgates 30. The sense amplifier amplifies the magnitude of the difference in the integrated current flowing in the outputs of the buffer amplifiers and senses in turn which of the outputs 170 and 178 has a larger integrated current as an indicator of the identity of the stored data (e.g., "1" or "0"). That information is latched for communication to a data readout and also for the refresh operation.

A first initialization circuit 188 communicates with the first input 84 of the latching sense amplifier 182, and a second initialization circuit 190 communicates with the second input 186. The initialization circuits 188 and 190 controllably latch one of two (high or low) reference voltages to the respective sense amplifier inputs 184 and 186. These reference voltages are sufficiently different that the sense amplifier can easily detect and amplify the difference to the rails of the supply on application of the latch circuitry.

Each ferroelectric capacitor and the input capacitance $C_{ba}$ of the buffer amplifiers are arranged in a circuit element termed a Sawyer-Tower circuit. In this circuit element to which a voltage $V_a$ is applied across the ferroelectric capacitor (152, 154) of capacitance $C_{fe}$ and the linear buffer amplifier input capacitance $C_{ba}$, the voltage $V_{fe}$ across the ferroelectric capacitor is $$V_{fe}=C_{ba}(V_a/(C_{ba}+C_{fe}).$$

The capacitance of the ferroelectric capacitor is associated with its ferroelectric polarization state, and therefore the voltage across the two ferroelectric capacitors is different for the two Sawyer-Tower circuit elements used in the memory cell of FIG. 4. The maximum voltage across the ferroelectric capacitor occurs when $C_{fe}$ is a minimum, and the minimum voltage across the ferroelectric capacitor occurs when $C_{fe}$ is a maximum. For all FIRM NDRO reads of the two ferroelectric capacitors, one will have the maximum voltage across it while the other will have a lower voltage across it due to the fact that some polarization was switched from it during the application of the read voltage $V_a$.

The maximum polarization that can be switched from the ferroelectric capacitor is obtained by assuming that the capacitance of the ferroelectric capacitor is very much greater than that of the buffer amplifier capacitor $C_{ba}$. The amount of polarization is the product of $C_{ba}$ and $V_a$.

The signal sensed by the sense amplifier is related to the difference between the applied voltage and the voltage across the ferroelectric capacitor.

In a preferred FIRM NDRO design, $C_{ba}$ and the size of the ferroelectric capacitors are chosen so that, when the ferroelectric polarization of the ferroelectric capacitor is saturated such that no polarization is switched upon application of the drive line voltage $V_a$, $$V_a - V_{ba} = 3\ V_c$$

where $V_{ba}$ is the voltage at the buffer amplifier and $V_c$ is the coercive voltage of the ferroelectric capacitor.

Returning to the memory unit 150 of FIG. 5, to write data to the memory unit the latch on the sense amplifier is disabled, the bypass circuits 28 are shorted and the initialization circuits 188 and 190 provide the appropriate reference levels for the desired data. Thus, before writing (or reading) data, the inputs to the sense amplifier are connected to a known voltage, a step termed precharging. For example, the reference voltage of circuit 188 might be high and the reference voltage of circuit 190 low for a data "1", and the reference voltage of circuit 188 might be low and the reference voltage of circuit 190 high for a data "0". The input state is latched into the sense amplifier without any voltage applied to the drive line 160 writing the polarization of the capacitor on the high side of the sense amplifier to the desired state. To write the capacitor on the low side of the sense amplifier a pulse is applied to the drive line 160 from the voltage source 162. After the drive line pulse voltage is removed the latch of the sensing amplifier 182 is released. This completes the data write operation.

To read data from the memory unit 150 and refresh the memory unit 150, the initialization circuits 188 and 190 are used to reference the inputs of the buffer and sense amplifier identically and then disabled, precharging the circuit. During precharge the buffer bypass is shorted. Following precharge the bypass is opened and a voltage pulse is applied from the voltage source 162 to the drive line 160 to effect a partial switch of the ferroelectric polarization of only the one of the two ferroelectric capacitors 152 or 154 that is oppositely polarized to the voltage pulse. Before the drive line pulse is removed, the sense amplifier 182 is latched, and the state of the latch, reflecting the "1" or "0" nature of the stored data, is communicated to the external circuitry that requested the reading of data. When the drive line pulse is removed the bypass is shorted and the latched sense amplifier output restores the polarization into the partially depolarized capacitor which accomplishes the refresh. The latch of the sense amplifier 182 is released, completing the read and refresh. In the event that the read is interrupted during the application of the drive line pulse, the data in the memory unit 150 is not lost. The data may be later recalled at least several times prior to any refreshing of the memory.

In this preferred approach, the properties of the ferroelectric capacitors 152 and 154, the properties of the buffer amplifiers 26, and the drive line voltage from the voltage source 162 are selected to meet particular criteria so that only a partial switching of charge occurs with each application of the drive line voltage during sensing. The product of the drive line voltage applied from the voltage source 162 and $C_{ba}$ is less than half the switchable ferroelectric polarization of each of the ferroelectric capacitors 152 or 154. The maximum voltage across each of the ferroelectric capacitors 152 or 154 when the ferroelectric capacitors are about in their minimum capacitance state (i.e., minimum capacitance or nearly the minimum capacitance state) is selected to just saturate their polarization. In the case of the preferred Y1 material used in the fabrication of the ferroelectric capacitors, which material will be discussed subsequently, the maximum voltage is from about 2½ to 3½, most preferably 3, times the coercive voltage of the ferroelectric capacitor. The maximum voltage $V_{max}$ is defined in terms of the minimum capacitance of the ferroelectric capacitor, $C_{fem}$, referenced earlier. It may be calculated as $$V_{max} = C_{ba}(V_a/(C_{ba} + C_{fem}))$$

$C_{ba}$ is the input capacitance of the buffer amplifier and $V_a$ is the applied voltage.

The just-completed description relates to a single memory cell for storing a single bit of data. The memory cell circuitry involving the ferroelectric capacitors 152 and 154 may be repeated as many times as necessary to effect multiple memory cells for storing multiple data bits. The voltage source 162, sense amplifier 182, and initialization circuits 188 and 190 are common to the multiple memory cells and connected as needed. In such a memory cell array, individual cells are addressed using conventional addressing techniques.

Figure 6:
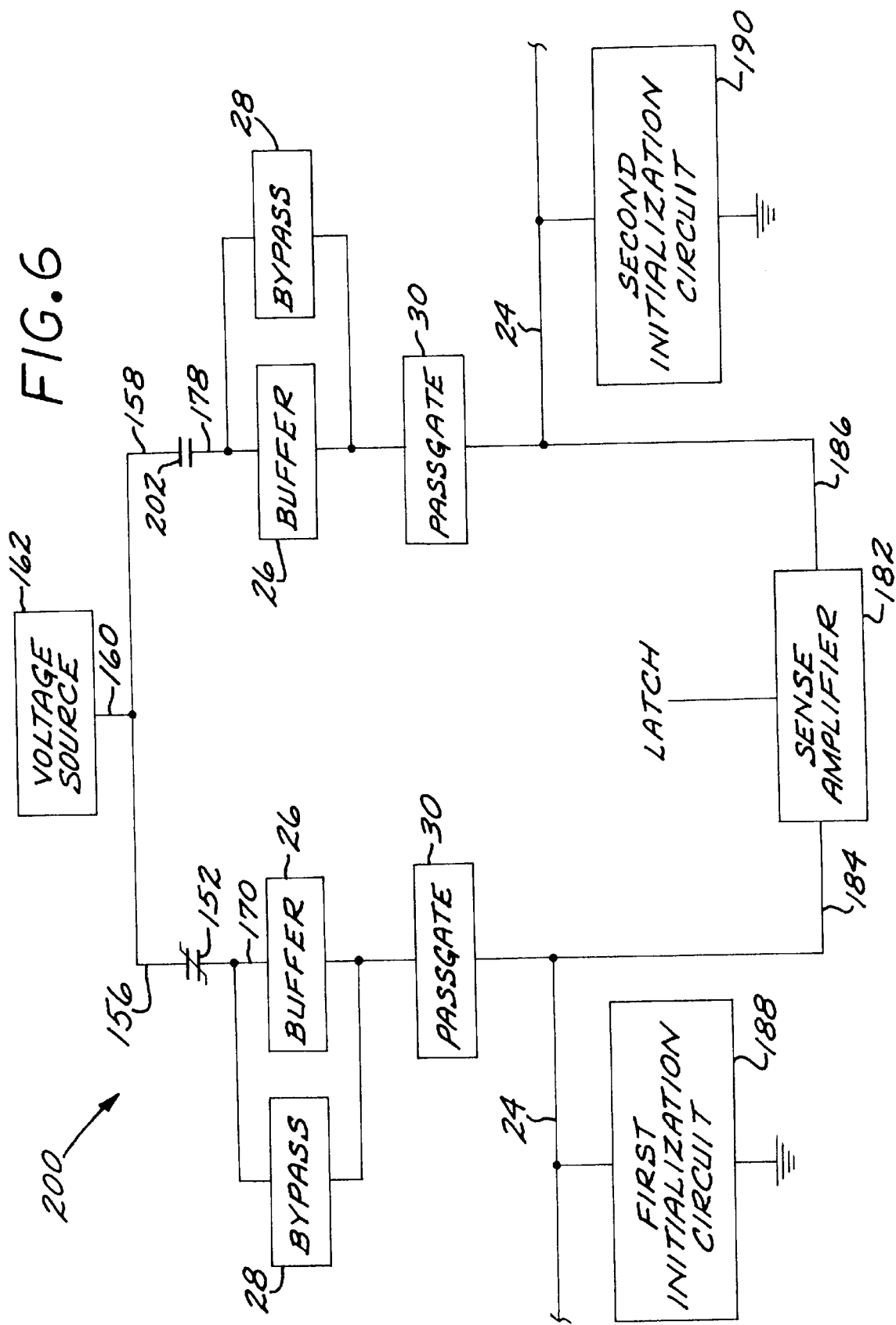
FIG. 6 is a circuit diagram of a second type of a ferroelectric interruptible read memory element utilizing the approach of the invention.

FIG. 6 depicts a variation of the present approach. A memory unit 200 is identical to the memory unit 150, except that the second ferroelectric capacitor 154 is replaced by a standard linear capacitor 202 used as a reference. That is, only one of the capacitors need be a ferroelectric capacitor.

As with the embodiment of FIG. 5, the operating parameters of the circuit and the component values are carefully selected to ensure only a partial switching of the charge during sensing. The maximum voltage across the ferroelectric capacitor 152 when the ferroelectric capacitor is at about its minimum capacitance state (i.e., minimum capacitance or nearly the minimum capacitance state) is selected to just saturate its polarization. In the case of the preferred Y1 material used in the fabrication of the ferroelectric capacitor, the maximum voltage is from about 2½ to 3½, most preferably 3, times the coercive voltage of the ferroelectric capacitor. The capacitance of the reference capacitor 202 is greater than the minimum capacitance of the ferroelectric capacitor 152, but less than the effective ferroelectric capacitance associated with the second application of the applied voltage from the source 162 to the ferroelectric capacitor with a saturated polarization opposite to the field generated by the drive line voltage. This approach reduces the number of interrupts possible before the data is lost. The capacitance of the reference capacitor can be adjusted to provide the optimum performance. An alternative circuit would provide a stable voltage reference in place of the capacitance voltage divider. For example, the stable, controllable reference voltage could be applied from the second initialization circuit.

The ferroelectric capacitors 152 and 154 may be made with any ferroelectric material. The preferred ferroelectric material is a known layered superlattice ferroelectric material that is available commercially from Symetrix Corporation and is described, for example, in PCT publications WO93/12542, WO93/12538, and WO93/10627, whose disclosures are incorporated by reference. Y1 generally has a composition of $$(A1_{w1})^{+a1}(A2_{w2})^{+a2} \ldots (Aj_{wj})^{+aj}$$
$$(S1_{x1})^{+s1}(S2_{x2})^{+s2} \ldots (Sk_{xk})^{+sk}$$
$$(B1_{y1})^{+b1}(B2_{y2})^{+b2} \ldots (Bl_{yl})^{+bl}(Q_z)^{-2},$$

where A1, A2, ... Aj are A-site elements in a perovskite-like structure; S1, S2, ... Sk are superlattice generator elements; B1, B2, and Bl are B-site elements in a perovskite-like structure; Q is an anion; the superscripts indicate valences of the respective elements; the subscripts indicate the average number of atoms of the element in the unit cell of the perovskite-like structure, and at least w1 and y1 are non-zero. Examples of A-site elements include strontium, calcium, barium, bismuth, cadmium, and lead; examples of B-site elements include titanium, tantalum, hafniuin, tungsten, niobium, and zirconium; examples of superlattice generator elements S include bismuth, scandium, yttrium, lanthanum, antimony, chromium, and thallium; examples of anions include oxygen, chlorine, and fluorine.

The layered superlattice ferroelectric materials such as Y1 are highly resistant to fatigue of the polarization properties. Many other ferroelectric materials exhibit a degradation in their polarization properties after numerous state switches of the type required in a ferroelectric memory device. Materials such as Y1 are not subject to much, if any, fatigue-based degradation.

Other known ferroelectric materials are also operable in the invention. Examples include $KNO_3$ (potassium nitrate), $PbLa_2$-$ZrO_2$-$TiO_2$ (PLZT), $PbTiO_3$-$PbZrO_3$ (lead zirconate titanate or PZT), and $PbTiO_3$ (lead titanate).

A second ferroelectric nondestructive readout memory is based on the observed capacitance variation as a ferroelectric capacitor changes from one saturated polarization state to the other. As in the case of the FIRM NDRO, this difference can be sensed using a capacitor voltage divider, and the size of the ferroelectric capacitor may be reduced by using the input capacitance of a buffer amplifier as the second capacitance instead of the conventional distributed capacitance of the bit line.

Figure 7:
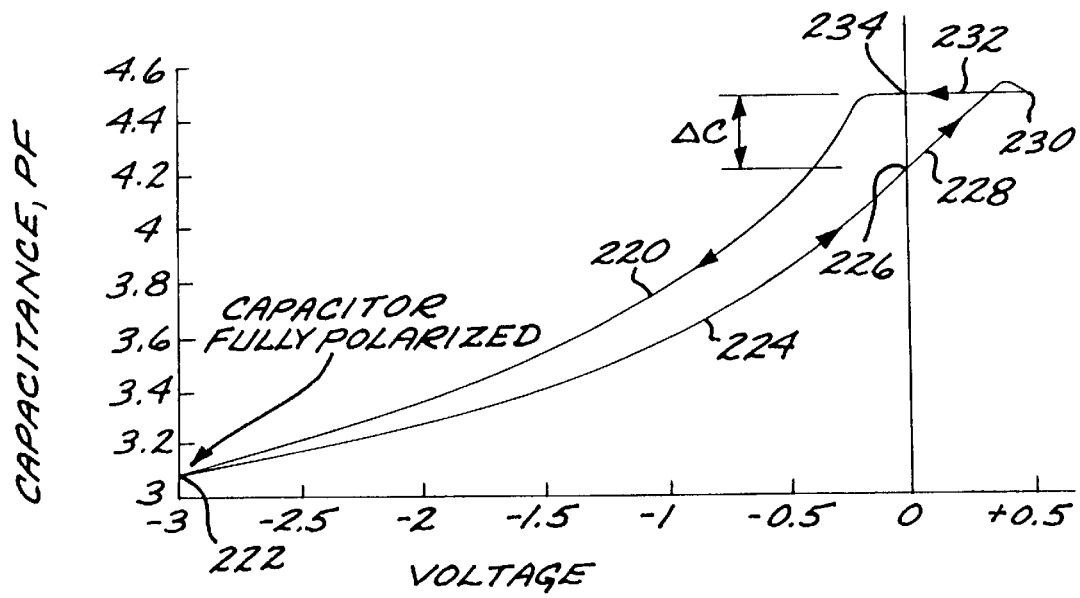
FIG. 7 is a capacitance-voltage plot for a Y1 ferroelectric material used in a nondestructive read ferroelectric memory.

FIG. 7 depicts the capacitance-voltage characteristic of the "Y1" ferroelectric material, exhibiting the observed capacitance change with polarization state and the above-mentioned capacitance effect. The useful capacitance characteristics can best be understood in a discussion of the behavior of the material (luring the application of an electric field to the material. Throughout the discussion reference is made to a "Y1" material that constitutes the preferred ferroelectric material exhibiting the Ramer-Drab Effect. These references are made not by way of limitation of the effect and its application, but by way of illustration of values and properties. For convenience, this approach is referred to as the capacitance delta nondestructive readout (CD-NDRO).

FIG. 7 is a capacitance-voltage plot for a material exhibiting the Ramer-Drab Effect, in this case the Y1 material. As a negative voltage of at least about six times the coercive voltage, or about −3 volts or greater in the case of Y1 material, is applied across the ferroelectric material, the capacitance of the ferroelectric material follows curve 220 to the left to the fully polarized state 222. When the electric field is removed, the capacitance follows the curve 224 to the right, to a first zero field capacitance 226. Thus, creation of a saturated polarization state in a first direction results in the first zero field capacitance 226.

As a voltage is next applied in the opposite direction across the ferroelectric material, a positive voltage in the illustration, the capacitance follows the extension of curve 224, indicated as curve 228. As the positive voltage increases, the polarization state of the ferroelectric material changes from the fully saturated polarization state to a partially Polarized state. However, in the present approach the applied positive voltage is less than that required to fully saturate the polarization state, and is preferably about equal to the coercive voltage, as shown in FIG. 7 at numeral 230.

When the voltage is returned to zero, along curve 232, the capacitance is measured as a second zero field capacitance 234. The second zero field capacitance 34 differs from the first zero field capacitance 226 by a relatively small, but definite and m-easurable, capacitance difference (ΔC). The capacitance difference is typically on the order of about 10 percent of the capacitance values.

A memory unit can therefore be based upon writing to a single ferroelectric capacitor to establish the first zero field state 226 to record one sense of a binary data bit (e.g., the "0" state) and, at some other time, to establish the second zero field state 234 to record the other sense of the binary data bit (e.g., the "1" state). The data is read from the memory unit by sensing the capacitance value in a conventional manner. If, as is preferred, the sensing of the capacitance is implemented such that it does not alter the polarization state, the data bit can be read from the memory as many times as desired, without requiring any refresh of the memory unit. For reasons that will be discussed subsequently, in practical applications it is preferred to use two ferroelectric capacitors arranged in parallel so that the opposite states can be alternatively written to the two ferroelectric capacitors and a differential capacitance sensed during reading of the data. This memory unit using two ferroelectric capacitors operates on the same physical principles discussed above in regard to the ferroelectric material as the memory unit using a single ferroelectric capacitor.

Figure 8:
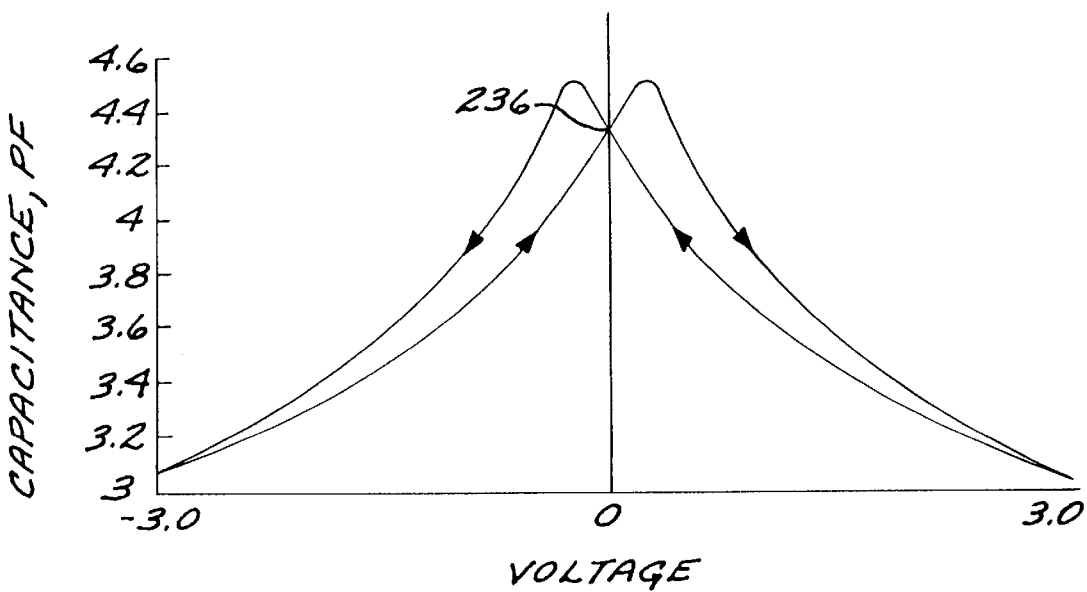
FIG. 8 is a capacitance-voltage plot for a typical conventional ferroelectric material.

FIG. 8 illustrates, by way of comparison, the prior understanding of the ferroelectric material. When the ferroelectric material is fully saturated with a negative voltage (the leftmost extent of the curves) and returned to the zero field state, a zero field capacitance 236 is observed. If the ferroelectric material is thereafter fully saturated with a positive voltage (the rightmost extent of the curves) and returned to the zero field state, the same zero field capacitance 236 is observed. That is, the zero field capacitance produced by fully saturating the polarization cannot be used itself as a data indicator.

Figure 9:
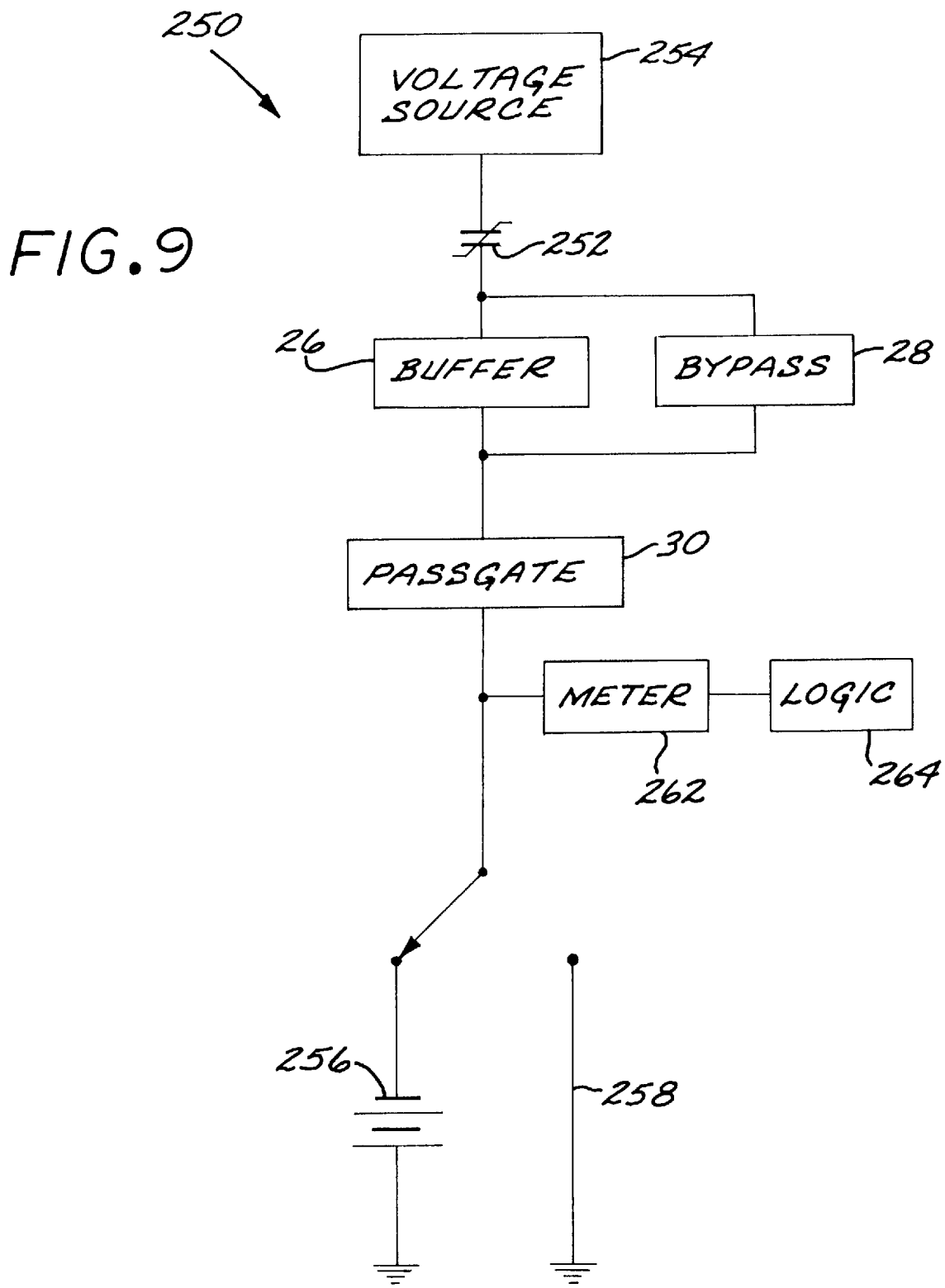
FIG. 9 is a schematic drawing of a basic nondestructive read ferroelectric memory unit using a single ferroelectric capacitor.

FIG. 9 depicts a basic form of the CD-NDRO memory unit 250 having a single ferroelectric capacitor 252 whose insulator shows the differential-capacitance phenomenon. A first side of the ferroelectric capacitor 252 is connected to a variable voltage source 254. A second side is switchably connected, through the buffer amplifier 26, parallel bypass circuit 28, and series passgate 30 to a saturating voltage source 256 having a voltage sufficient high to fully saturate the ferroelectric capacitor 252 or to ground 258. A current meter 262 also communicates with the output of the buffer amplifier connected to the ferroelectric capacitor 252, while the buffer amplifier bypass is shorted.

Data is written to the memory unit 250 by connecting the second side of the ferroelectric capacitor 252 to the saturating voltage source 256 to fully saturate the ferroelectric capacitor 252 in the negative direction, and thereafter connecting the second side of the ferroelectric capacitor to ground 258. A voltage pulse is produced by the variable voltage source 254. If the ferroelectric capacitor is to be left in the first zero field capacitance state to record, for example, a "0" data bit, the voltage pulse has a zero voltage. If the ferroelectric capacitor is to be left in the second zero field capacitance state to record, for example, a "1" data bit, the voltage pulse has a positive voltage, preferably equal to about the coercive voltage of the ferroelectric capacitor. In the case of a typical Y1 material, the negative saturating voltage is −4 volts, and the positive voltage is about 0.5 volts.

With the buffer amplifier bypass open, the data is read by any approach that can sense the buffer output delta caused by the capacitance value of the ferroelectric capacitor 252. The reading approach preferably does not utilize a switching of charge in the ferroelectric capacitor, as this would reduce the number of possible interrupted reads to a value that depends upon the switched charge. The reading approach also preferably does not utilize the application of a DC biasing voltage to the ferroelectric capacitor, as this requires additional circuitry and can also cause switching of charge.

In the illustrated memory cell 250, data is read from the ferroelectric capacitor 252 by opening the bypass and connecting the second side of the ferroelectric capacitor 252 to ground through the buffer amplifier 26, applying a small read voltage pulse, typically about 1 volt, to the first side of the ferroelectric capacitor 252 using the voltage source 254, and sensing the voltage on the output of the buffer amplifier using the current meter 262. The input to the buffer amplifier is the voltage division of the ferroelectric capacitance and the input capacitance of the buffer amplifier as described when discussion the FIRM NDRO. The greater the measured voltage, the higher the capacitance of the ferroelectric capacitor 252. A read logic unit 264 uses the values of the first zero field capacitance state and the second zero field capacitance state used to store the data bit, together with the measured current produced by the read pulse, to determine the identity of the stored data.

While operable, the memory cell 250 has the drawback that the absolute values of the two zero field capacitances must be known to some degree of accuracy. These values can depend upon variations in the dielectric material and the geometry of the ferroelectric capacitor. For a large memory array, the variations between individual ferroelectric capacitors may be sufficiently great that ambiguity can arise in sensing the stored data values in different ferroelectric capacitors. Reference values must also compensate for temperature effects in the ferroelectric capacitors.

To overcome this problem, known techniques for constructing two-capacitor memory units can be used. The two-capacitor memory unit allows information to be stored as the sense (i.e., positive or negative difference) of the capacitances of the two capacitors, so that the absolute values of capacitance of the capacitors need not be known.

Figure 10:
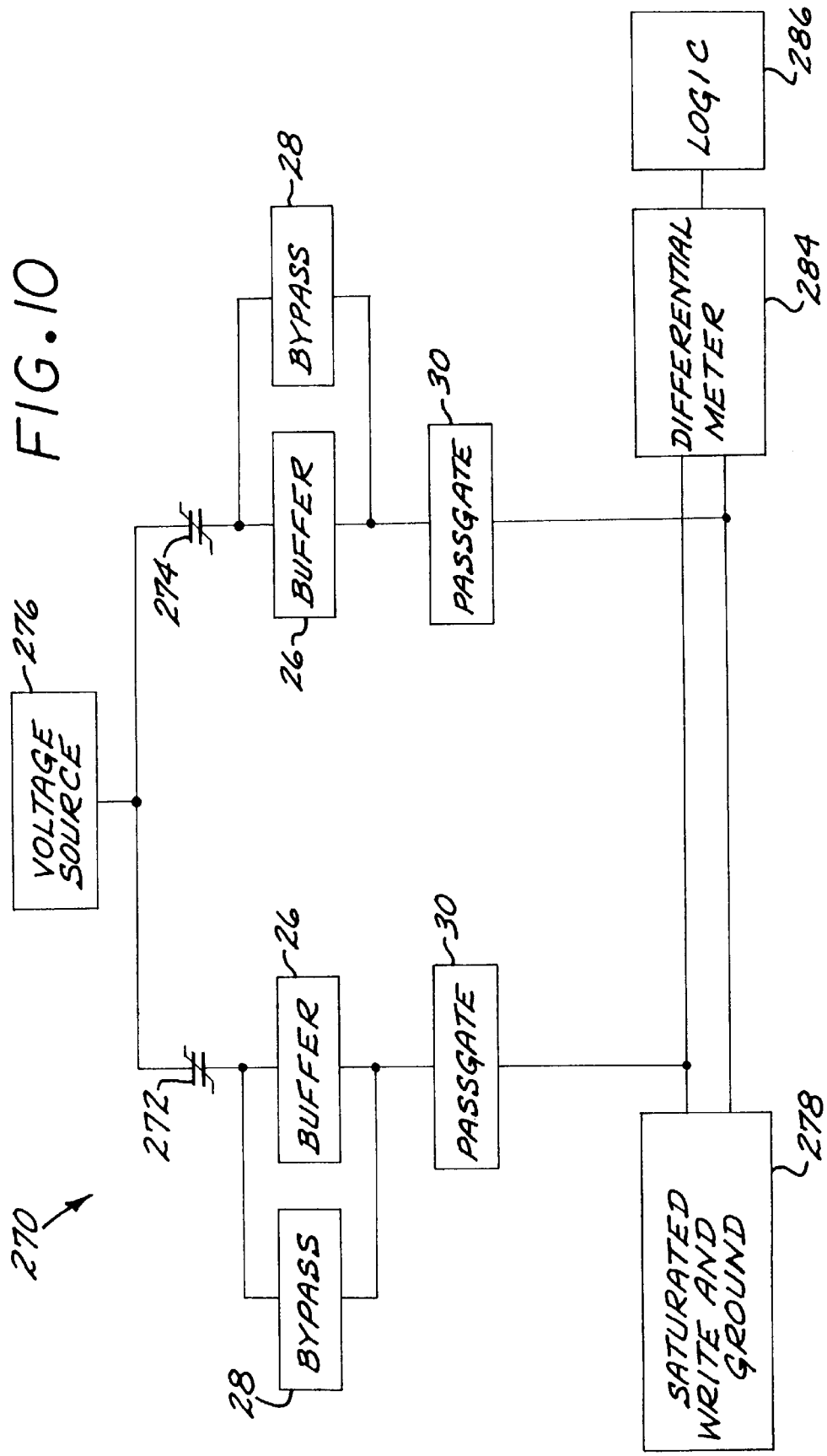
FIG. 10 is a schematic drawing of a basic nondestructive read ferroelectric memory unit using two ferroelectric capacitors or one ferroelectric capacitor and a linear capacitor, in parallel.

Referring to the embodiment of a memory unit 270 illustrated in FIG. 10, the first sides of a first ferroelectric capacitor 272 and a second ferroelectric capacitor 274 are connected in parallel to a variable voltage source 276. The second sides of the ferroelectric capacitors 272 and 274 are each connected, through their respective buffer amplifiers 26, parallel bypass circuits 28, and series passgates 30 to a write/ground source 278 having the same function as the saturating voltage source 256 and the ground 258 of FIG. 9. The second sides are also connected to a differential meter 284. A read logic unit 286 interprets the relative magnitude of the sensed differences generated by the voltage division occurring between the input capacitance of the buffer amplifier and the ferroelectric capacitor. These elements operate in the same manner as discussed in relation to the embodiment of FIG. 9, except as discussed next.

In operation, with the buffer amplifier bypass shorted the first ferroelectric capacitor 272 is driven to one of the zero field capacitance states and the second ferroelectric capacitor 274 is driven to the other of the zero field capacitance states. To write a "1", for example, the first ferroelectric capacitor is driven to the lower zero field capacitance and the second ferroelectric capacitor is driven to the higher zero field capacitance. To write a "0" in this example, the first ferroelectric capacitor is driven to the higher zero field capacitance and the second ferroelectric capacitor is driven to the lower zero field capacitance. With the buffer amplifier bypass open, the data is read by determining which of the two capacitors has the higher capacitance and highest buffer amplifier output, and there is no need to establish the absolute capacitance value.

The memory unit 270 also is operable if only one of the capacitors 272 and 274 is a ferroelectric capacitor and the other is a conventional linear capacitor.

Although particular embodiments of the invention has been described in detail for purposes of illustration, various modifications and enhancements may be made without departing from the spirit and scope of the invention. Accordingly, the invention is not to be limited except as by the appended claims.

What is claimed is:

1. A nondestructive readout memory, comprising
   a bitline data signal input;
   at least one memory unit, each memory unit having a data state and comprising
      a ferroelectric capacitor with a polarization state corresponding to the memory data state,
      a buffer amplifier in electrical series relationship with the ferroelectric capacitor and the bitline data signal input, and
      a controllable bypass circuit in electrical parallel relationship with the buffer amplifier;
   means for writing a polarization state into each ferroelectric capacitor responsive to the bitline data signal input; and
   means for sensing the polarization state of each ferroelectric capacitor.

2. The memory of claim 1, wherein the at least one memory unit comprises a plurality of memory units.

3. The memory of claim 1, wherein the buffer amplifier is a metal-oxide-semiconductor field effect transistor.

4. The memory of claim 1, wherein
   each memory cell comprises
      the first ferroelectric capacitor and a second ferroelectric capacitor electrically connected in a parallel arrangement, and
      a second buffer amplifier in electrical series relationship with the second ferroelectric capacitor and the bitline data signal input;
   the means for writing comprises
      means for writing controllably different polarization states into the two ferroelectric capacitors using a single input signal;
   the means for sensing comprises
      means for sensing the difference in stored polarizations in the first ferroelectric capacitor and the second ferroelectric capacitor, the means for sensing causing only a partial switching of the polarization state of the first ferroelectric capacitor and not disturbing the polarization state of the second ferroelectric capacitor; and
   the memory unit further comprises
      means for restoring the original ferroelectric polarization of the ferroelectric capacitors following operation of the means for sensing.

5. The memory of claim 4, wherein the first ferroelectric capacitor and the second ferroelectric capacitor each have a dielectric element made of a layered superlattice ferroelectric material.

6. The memory of claim 4, wherein the maximum voltage across the first ferroelectric capacitor during read is from about 2½ to 3½ times the coercive voltage of the first ferroelectric capacitor, and wherein the maximum voltage across the second ferroelectric capacitor during read is from about 2½ to 3½ times the coercive voltage of the second ferroelectric capacitor.

7. The memory of claim 1, wherein the ferroelectric capacitor comprises
an insulator formed of a ferroelectric material characterized by a zero field capacitance which is controllably dependent upon the electrical charging path by which the zero field capacitance is reached;

the means for writing comprises
means for writing two different capacitance states to the ferroelectric capacitor at different times, the different capacitance states reflecting different stored data values; and the means for sensing comprises
means for reading the capacitance of the ferroelectric capacitor.

8. The memory of claim 7, wherein each memory unit further includes:

a second ferroelectric capacitor in parallel with the ferroelectric capacitor and having an insulator with the same materials properties as the ferroelectric material of the ferroelectric capacitor; and a second buffer amplifier in electrical series relationship with the second ferroelectric capacitor and the bitline data signal input.

9. The memory of claim 7, wherein each memory unit further includes:

a second linear capacitor in parallel with the ferroelectric capacitor.

10. A nondestructive readout memory, comprising a bitline data signal input;

at least one memory unit, each memory unit having a data state and comprising
a ferroelectric capacitor with a polarization state corresponding to the memory data state, wherein the ferroelectric capacitor comprises an insulator formed of a ferroelectric material characterized by a zero field capacitance which is controllably dependent upon the electrical charging path by which the zero field capacitance is reached, and a buffer amplifier in electrical series relationship with the ferroelectric capacitor and the bitline data signal input;

means for writing a polarization state into each ferroelectric capacitor responsive to the bitline data signal input; and means for sensing the polarization state of each ferroelectric capacitor.

11. The memory of claim 10, wherein the means for writing comprises
means for writing two different capacitance states to the ferroelectric capacitor at different times, the different capacitance states reflecting different stored data values; and the means for sensing comprises
means for reading the capacitance of the ferroelectric capacitor.

12. The memory of claim 10, wherein each memory unit further includes:

a second ferroelectric capacitor in parallel with the ferroelectric capacitor and having an insulator with the same materials properties as the ferroelectric material of the ferroelectric capacitor; and a second buffer amplifier in electrical series relationship with the second ferroelectric capacitor and the bitline data signal input.

13. The memory of claim 10, wherein each memory unit further includes:

a second linear capacitor in parallel with the ferroelectric capacitor.

* * * * *

UNITED STATES PATENT AND TRADEMARK OFFICE
CERTIFICATE OF CORRECTION

PATENT NO. : 5,966,318
DATED      : Oct. 12, 1999
INVENTOR(S): O. Glenn Ramer, et al It is certified that error appears in the above-identified patent and that said Letters Patent is hereby corrected as shown below:

On title page, item [73] should read as follows:

Assignee:   Raytheon Company, Lexington, Mass. and Symetrix Corporation, Colorado Springs, Colo.

Signed and Sealed this

Twenty-first Day of March, 2000

Attest:

Q. TODD DICKINSON

Attesting Officer

Commissioner of Patents and Trademarks